United States Patent
Su et al.

(10) Patent No.: US 6,242,963 B1
(45) Date of Patent: Jun. 5, 2001

(54) DIFFERENTIAL MIXER WITH IMPROVED LINEARITY

(75) Inventors: David K. Su; Masoud Zargari, both of Mountain View, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 09/392,982

(22) Filed: Sep. 9, 1999

(51) Int. Cl.[7] ........................................................ G06F 7/12
(52) U.S. Cl. ................................. 327/359; 327/563
(58) Field of Search .................................. 327/355, 356, 327/359, 407, 408, 560, 563

(56) References Cited

U.S. PATENT DOCUMENTS

| | | | |
|---|---|---|---|
| 5,630,228 | * | 5/1997 | Mittel .................................. 455/326 |
| 5,844,449 | * | 12/1998 | Abeno et al. ........................ 332/105 |
| 5,859,559 | * | 1/1999 | Hong et al. .......................... 327/359 |
| 5,896,063 | * | 4/1999 | Marsh et al. ........................ 330/254 |
| 5,901,350 | * | 5/1999 | Stoichita et al. .................... 455/333 |
| 5,912,583 | * | 6/1999 | Pierson et al. ...................... 327/553 |
| 5,959,491 | * | 9/2000 | Kang ................................... 327/359 |
| 6,084,460 | * | 7/2000 | Takeuchi ............................. 327/357 |

OTHER PUBLICATIONS

Analysis and Design of Analog Intergrated Circuits/Paul R. Gray and Robert G. Meyer, John Wiley & Sons, Inc. (1993), pp. 270–275.

Design of Analog CMOS Integrated Circuits/Behzad Razavi, The McGraw–Hill companies, Inc. (2000), pp. 15–22.

* cited by examiner

*Primary Examiner*—Jeffrey Zweizig
(74) *Attorney, Agent, or Firm*—Pillsbury Winthrop LLP (57) ABSTRACT

A mixing apparatus includes a Gilbert cell connected to a first load and a second load. In one embodiment each load contains transistors that are configured as a diode and a triode, where these circuits are additively combined to achieve substantially linear voltage-current characteristics over a predetermined range. The mixing apparatus takes two pairs of differential inputs and produces a pair of differential outputs. Because of the substantial linearity of the loads, the inputs and outputs of the mixing apparatus are acceptable over a relatively large range of input settings. In other embodiments each load may contain a transistor configured as a triode and a resistor, where these circuits are likewise additively combined to achieve substantially linear voltage-current characteristics over a predetermined range.

41 Claims, 6 Drawing Sheets n: nmos
P: Pmos

FIG. 1

FIG. 2 n: nmos
P: Pmos

FIG. 3 n: nmos
P: Pmos

DIFFERENTIAL MIXER WITH IMPROVED LINEARITY

BACKGROUND OF THE INVENTION

1. Field of Invention

The present invention relates to mixer for use in electrical systems and more particularly to a mixer that has a relatively high linearity.

2. Description of Related Art

In the development of mixers for use in electrical systems, two types of loads have commonly been used for mixers based on Gilbert cells: resistive loads and MOSFET loads, where typically these loads can be included in an integrated circuit (IC). (Thomas E. Lee, "The Design of CMOS Radio Frequency Integrated Circuits", Cambridge, 1998. Behzad Razavi, "RF Microelectronics", Prentice Hall, 1998.)

In systems based on resistive loads, generally the gain of the mixer can only be increased by increasing the value of the resistors. Resistors with large values have higher parasitic capacitance associated with them and therefore can dramatically reduce the mixer speed and bandwidth. At the same time, large resistive loads combined with the relatively high bias currents required for high-speed operation can cause problems in the biasing of the Gilbert cell transistors and thereby effectively impose practical limits on the signal swing of the mixer output. Furthermore, the size of the resistive load may vary due to process variations by 30–40%, a variation that can change the gain substantially.

In systems based on MOSFET loads, many of the difficulties associated with resistive loads no longer constrain the design. However, the nonlinear voltage-current characteristics of MOSFETs can create signal harmonics at the output nodes so that the output of the mixer is degraded. For example, if two inputs of the mixer consist of the following ideal sinusoids for the radio frequency (RF) and local oscillator (LO), RF: $\sin(\omega_{rf}*t)$ LO: $\sin(\omega_{lo}*t)$, then the resulting output includes the intermediate frequency (IF)

IF: $\sin(\omega_{if}*t)$ where $\omega_{if}=\omega_{rf}-\omega_{lo}$.

However, due to the nonlinear characteristics of MOSFET loads, the output will also contain components at odd multiples of the IF (i.e., $\sin(3*\omega_{if}*t)$, $\sin(5*\omega_{if}*t)$, . . . ). In general, for differential mixers the third harmonic will be much bigger in amplitude than other components. For a fixed input RF level, the ratio of the amplitude of the third harmonic to the amplitude of the desired IF signal (i.e., $\sin(\omega_{if}*t)$) is then a measure of the mixer's overall linearity. Making this ratio sufficiently small may pose substantial operational requirements on the mixer. Under nominal operating conditions, it is desirable to have the third harmonic be at least 35–40 dB below the desired IF signal.

Thus, the use of MOSFET loads in mixers based on Gilbert cells has many design advantages. However, the inherently nonlinear voltage-current characteristics of MOSFETs can lead to substantial performance limitations due to the creation of higher-order harmonics in the output.

Attempts to treat the nonlinear effects of MOSFETs have been developed in other contexts. For example, U.S. Pat. No. 5,717,362 (Patent '362) discloses an array oscillator circuit that includes a plurality of ring oscillators having a plurality of buffer stages for generating output signals. FIG. 16 of Patent '362 shows symmetric load elements 316 and 318, where symmetric load element 316 includes PMOS transistor 310 and diode-connected PMOS device 324 and symmetric load element 318 includes PMOS transistor 312 and diode-connected PMOS device 326. The biased PMOS device and the diode-connected PMOS device in each symmetric load element are sized to yield current-voltage characteristics that enable the buffer stage to achieve high dynamic supply noise rejection through a first-order cancellation of supply noise coupling. (Patent '362, column 12, line 64 to column 13, line 13.) This approach, while relevant to the technology of ring oscillators, is not directly applicable to mixers.

SUMMARY OF THE INVENTION

Accordingly, it is an object of this invention to provide a mixer that can be used to combine signals, where the mixer operates using loads that are substantially linear over a predetermined range.

It is a further object of this invention to provide a mixer for operation over a wide range of input signals.

It is a further object of this invention to provide a mixer that can be used in the final mixing operation in a receiver where the input signal level may be relatively large.

It is a further object of this invention to provide linearized loads using semiconductor circuits that are integrated with the mixing circuit.

The above and related objects of the present invention are realized by a mixing apparatus that includes a first load, a second load, and a mixer. The mixer is connected to the first load and the second load and is adapted to receive mixing inputs and mixing outputs. Each of the loads includes transistors that are configured as a triode and a diode. Each of the loads is substantially linear within a predetermined range.

The present invention possesses distinct advantages over other designs. By using substantially linear loads instead of conventional single-transistor loads, the linearity of the mixer is substantially improved so that the mixer is able to operate effectively over a much wider range of settings. As a result, the mixer achieves a high gain without corrupting performance.

These and other objects and advantages of the invention will become more apparent and more readily appreciated from the following detailed description of the presently preferred exemplary embodiments of the invention taken in conjunction with the accompanying drawings.

DETAILED DESCRIPTION OF THE PRESENTLY PREFERRED EXEMPLARY EMBODIMENTS

Figure 1:
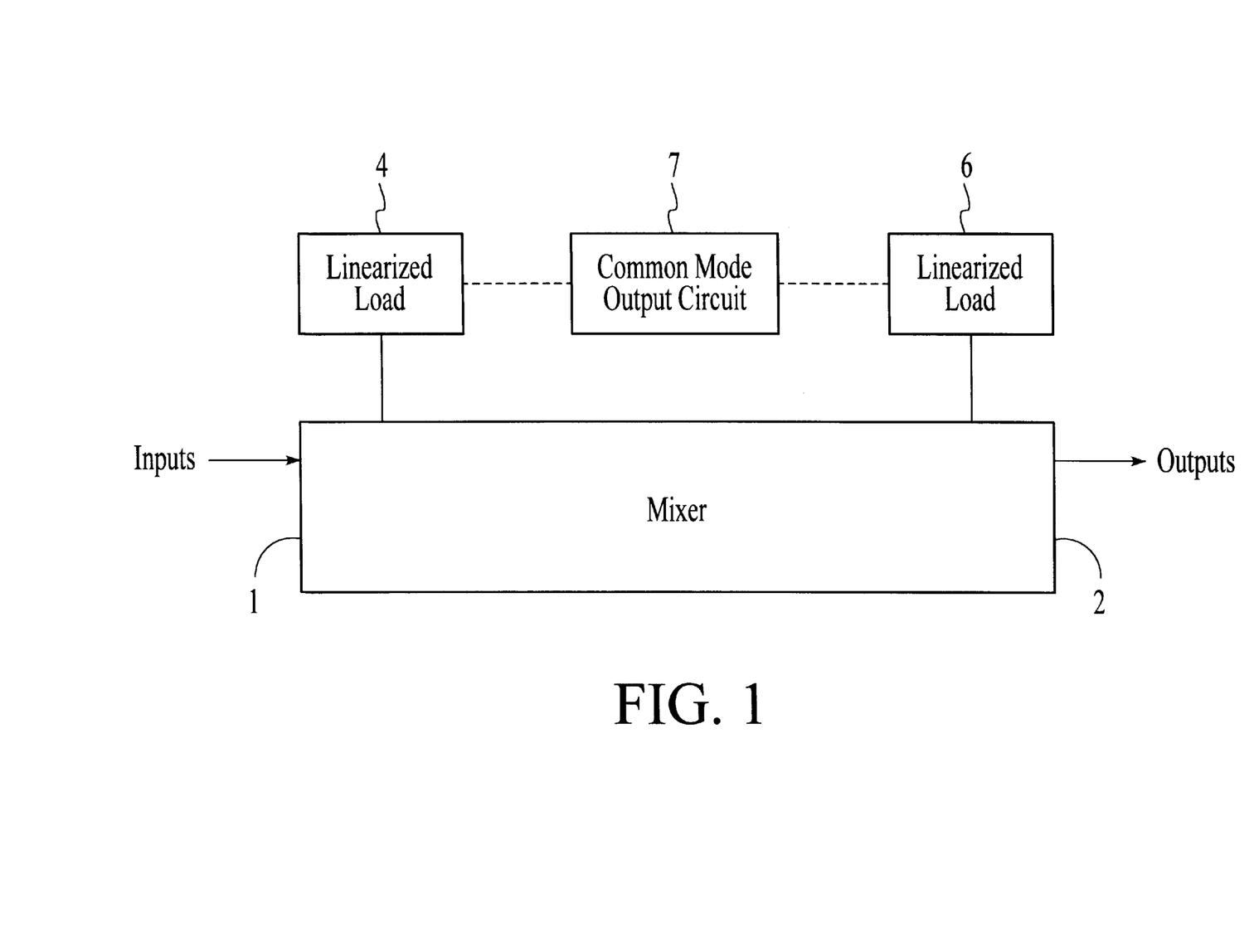
FIG. 1 is a diagram of a preferred embodiment of a mixer according to the present invention.
Figure 2:
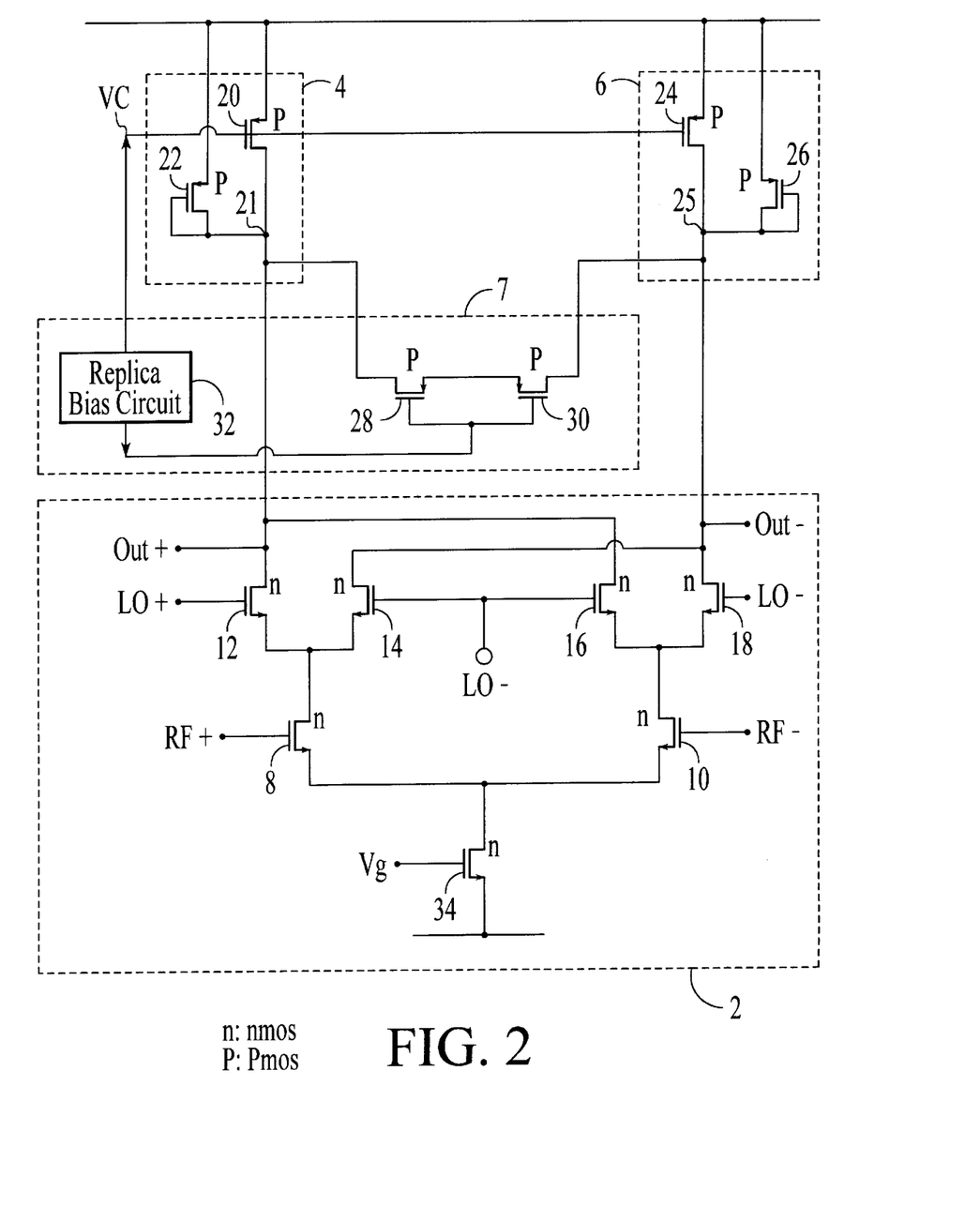
FIG. 2 is a circuit diagram of a preferred embodiment of a mixer according to the present invention.

The diagram of a preferred embodiment of the mixing apparatus 1 of the present invention in FIG. 1 includes a mixer 2, and linearized load circuits 4 and 6 and a common mode output circuit 7. Inputs and outputs of the mixer are also shown A circuit diagram in FIG. 2 illustrates more details of a preferred embodiment of the mixer of the present invention. Mixer 2 is preferably implemented as Gilbert cell comprised of PMOS transistors 8, 10, 12, 14, 16, 18, and 34, connected as illustrated in FIG. 2. Inputs are noted as differential inputs for a local oscillator, LO−, LO+, and a radio frequency, RF−, RF+. Outputs are noted as differential inputs, OUT−, OUT+. A ground voltage level Vhd gis also shown.

Linearized load circuit 4 includes PMOS transistors 20 and 22, whereas linearized load 6 includes PMOS transistors 24 and 26. Each of transistors 20 and 24 is configured as a triode, and each of transistors 22 and 26 is configured as a diode. A reference control voltage level $V_c$ is also shown. The voltage drops across load circuit 4 from $V_c$ to the voltage at node 21 and across load circuit 6 from $V_c$ to the voltage at node 25.

Figure 5:
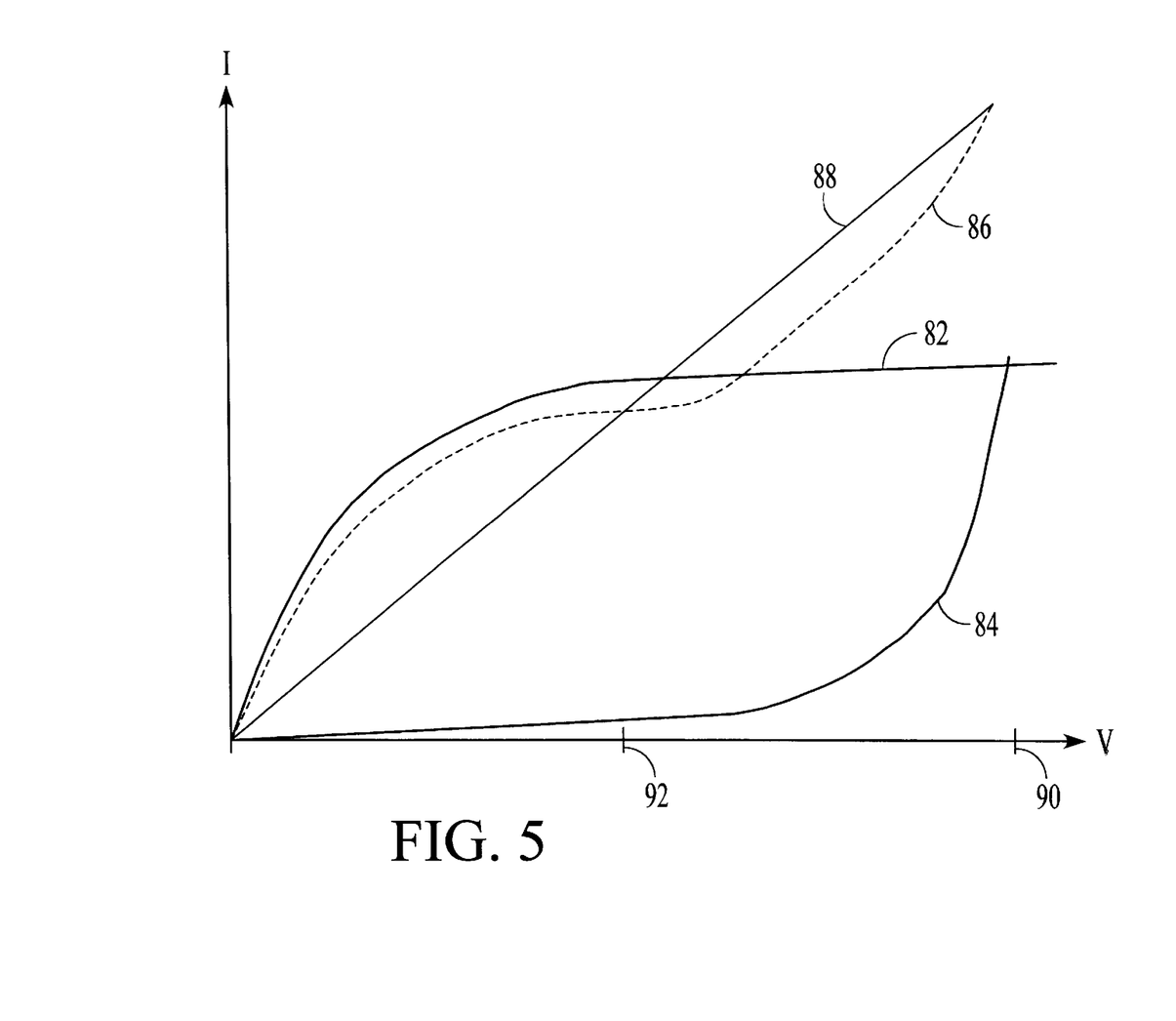
FIG. 5 is a diagram illustrating representative voltage-current curves for load circuits including transistors.

Common mode output circuit 7 includes PMOS transistors 28 and 30 and a replica bias circuit 32 that is used to control the voltage level so that the outputs of loads 4 and 6 at nodes 21 and 25 respectively provide substantially linear loads to mixer 2. That is, the voltage is set so that triode 20 and diode 22 combine to give a substantially linear load and triode 24 and diode 26 combine to give a substantially linear load. This combination is illustrated in the voltage-current curve of FIG. 5, where triode curve 82 and diode curve 84 are combined as in load circuits 4 and 6 in FIG. 2 to give a substantially linear curve 86 that approximates an idealized linear curve 88, the slope of which determines in part the gain of the mixer. This linearity is approximately valid up to a crossover voltage level 90 where curves 82 and 84 cross. Nominally, voltage level 90 may be approximately 1 volt. To maintain the linearity, common mode output circuit 7 sets the voltage drop across loads 4 and 6 up to the value at level 90. In a preferred embodiment, the voltage is set to voltage level 92, which approximates the crossover between curves 86 and 88.

In operation mixer 2 inputs differential inputs LO−, LO+, RF−, and RF+ and produces a differential output Out− and Out+. Linearized loads 4 and 8 provide loads to mixer 2 that are substantially linear, thereby allowing mixer 2 to operate over a relatively broad range of inputs. By using substantially linear loads instead of conventional single MOSFET loads, the linearity of the mixer is substantially improved so that the mixer is able to operate effectively over a much wider range of settings. As compared with a conventional MOSFET-based mixer, the present invention replaces a single MOSFET load with a substantially linear system of MOSFET elements. As a result, the mixer achieves a high gain without corrupting performance.

One degree of merit used to measure the degree of linearity achieved is the total harmonic distortion Δ, which can be defined as the sum of the amplitudes of the higher-order harmonics in the output of the mixer (i.e., $\sin(3*\omega_{if}*t)$, $\sin(5*\omega_{if}*t)$, . . . ). In general, the amplitude of the third harmonic $\sin(3*\omega_{if}*t)$ is dominant and can be used as an approximation of Δ. Under nominal conditions, the present invention can achieve a reduction in Δ of approximately 10 dB as compared with other mixers based on Gilbert cells with MOSFET loads.

In the embodiment illustrated in FIG. 2, the transistors 20, 22, 24, 26, 28, and 30, which are associated with linearized load circuits 4 and 6 and common mode circuit 7, are preferably PMOS transistors, and transistors 8, 10, 12, 14, 16, 18 and 34, which are associated with mixer 2, are preferably NMOS transistors. However, alternative embodiments can be developed where the transistors associated with the linearized load circuits and common mode circuit are NMOS transistors and the transistors associated with the mixer are PMOS transistors.

Figure 3:
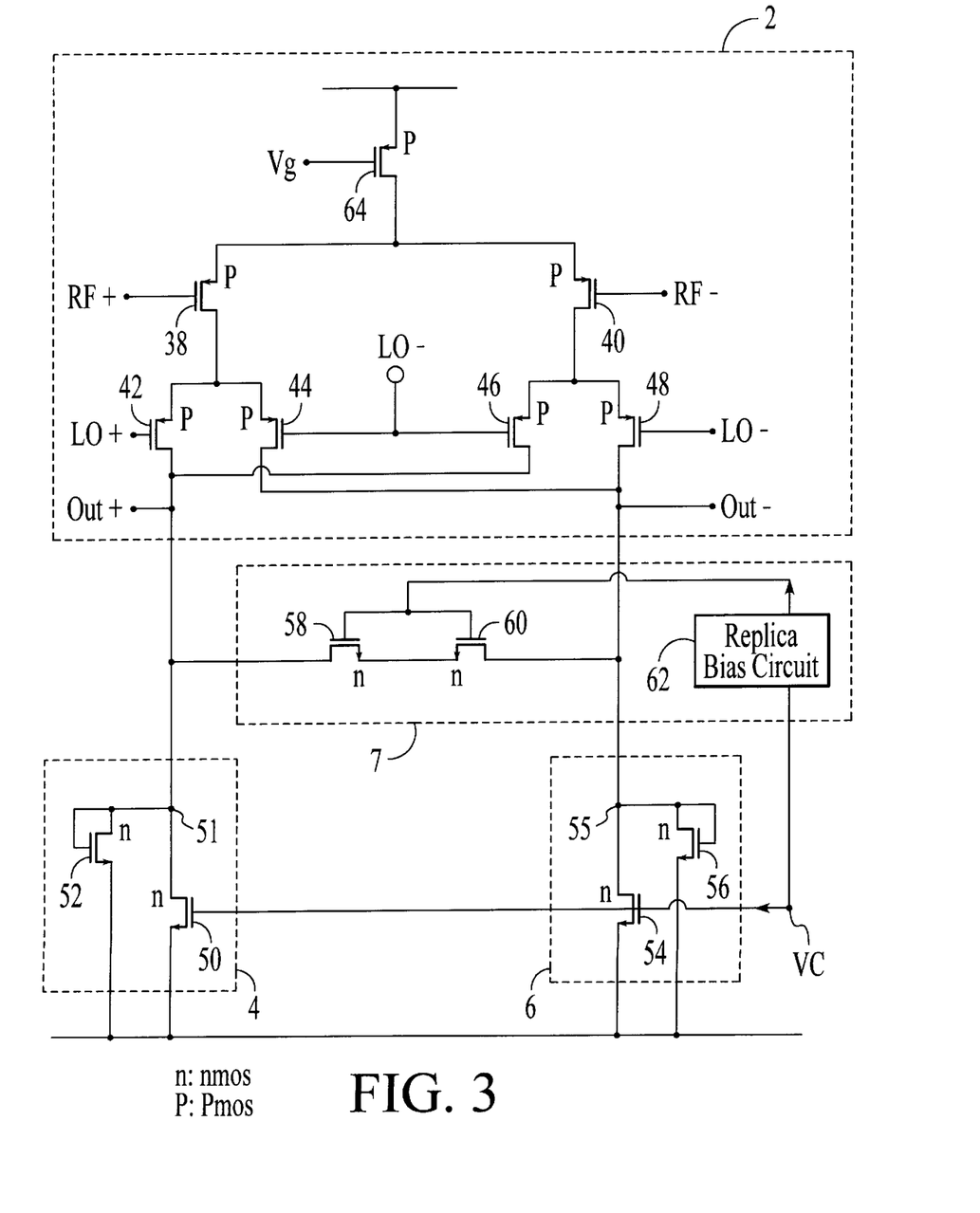
FIG. 3 is a circuit diagram of a second preferred embodiment of a mixer according to the present invention.

A circuit diagram in FIG. 3 illustrates details of a second preferred embodiment of the mixer of the present invention. Mixer 2 is implemented as Gilbert cell comprised of PMOS transistors 38, 40, 42, 44, 46, 48, and 64, connected as illustrated in FIG. 2. Inputs are noted as differential inputs for a local oscillator, LO−, LO+, and a radio frequency, RF−, RF+. Outputs are noted as differential inputs, Out−, Out+. A ground voltage level $V_g$ is also shown.

Linearized load circuit 4 includes NMOS transistors 50 and 52, whereas linearized load 6 includes NMOS transistors 54 and 56. Each of transistors 50 and 54 is configured as a triode, and each of transistors 52 and 56 is configured as a diode. A reference control voltage level $V_c$ is also shown. The voltage drops across load circuit 4 from $V_c$ to the voltage at node 51 and across load circuit 6 from $V_c$ to the voltage at node 55. Common mode output circuit 7 includes NMOS transistors 58 and 60 and a replica bias circuit 62. As in the first preferred embodiment illustrated in FIG. 2, circuit 7 controls the voltage level so that the outputs of loads 4 and 6 at nodes 51 and 55 respectively provide substantially linear loads to mixer 2.

Figure 4A:
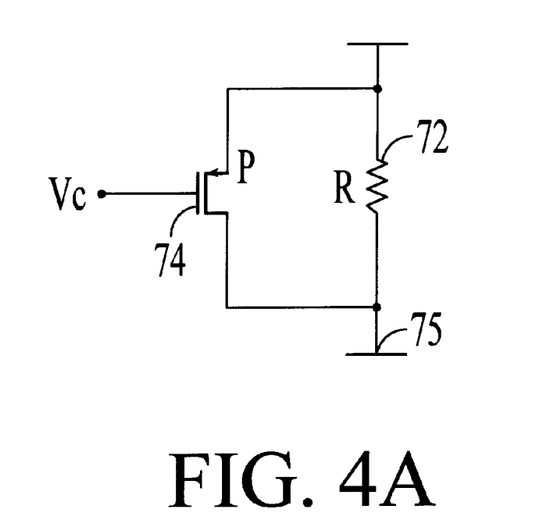
FIGS. 4A and 4B are circuit diagrams for alternative embodiments of the present invention.

Also, other types of linearized loads can be used to implement these circuits. For example, FIG. 4A illustrates a load circuit including a resistor 72 and a PMOS transistor 74 that is configured as a triode. The voltage across the circuit is from control voltage level $V_c$ to the voltage at node 75. In a third preferred embodiment of the present invention, a circuit as shown in FIG. 4A replaces each of circuits 4 and 6 in the embodiment of FIG. 2. The combination of a triode and a resistor to make a substantially linear load is illustrated in the voltage-current curve of FIG. 6, where triode curve 102 and resistor curve 104 are combined as in the circuit of FIG. 4A to give a substantially linear curve 106 that approximates an idealized linear curve 108, the slope of which determines in part the gain of the mixer. This linearity is approximately valid up to a crossover voltage level 110 where curves 102 and 104 cross. Nominally, voltage level 110 may be approximately 1 volt. To maintain the linearity, common mode output circuit 7 sets the voltage drop across loads 4 and 6 up to the value at level 110. Preferably, the voltage is set to voltage level 112, which approximates the crossover between curves 106 and 108.

Figure 6:
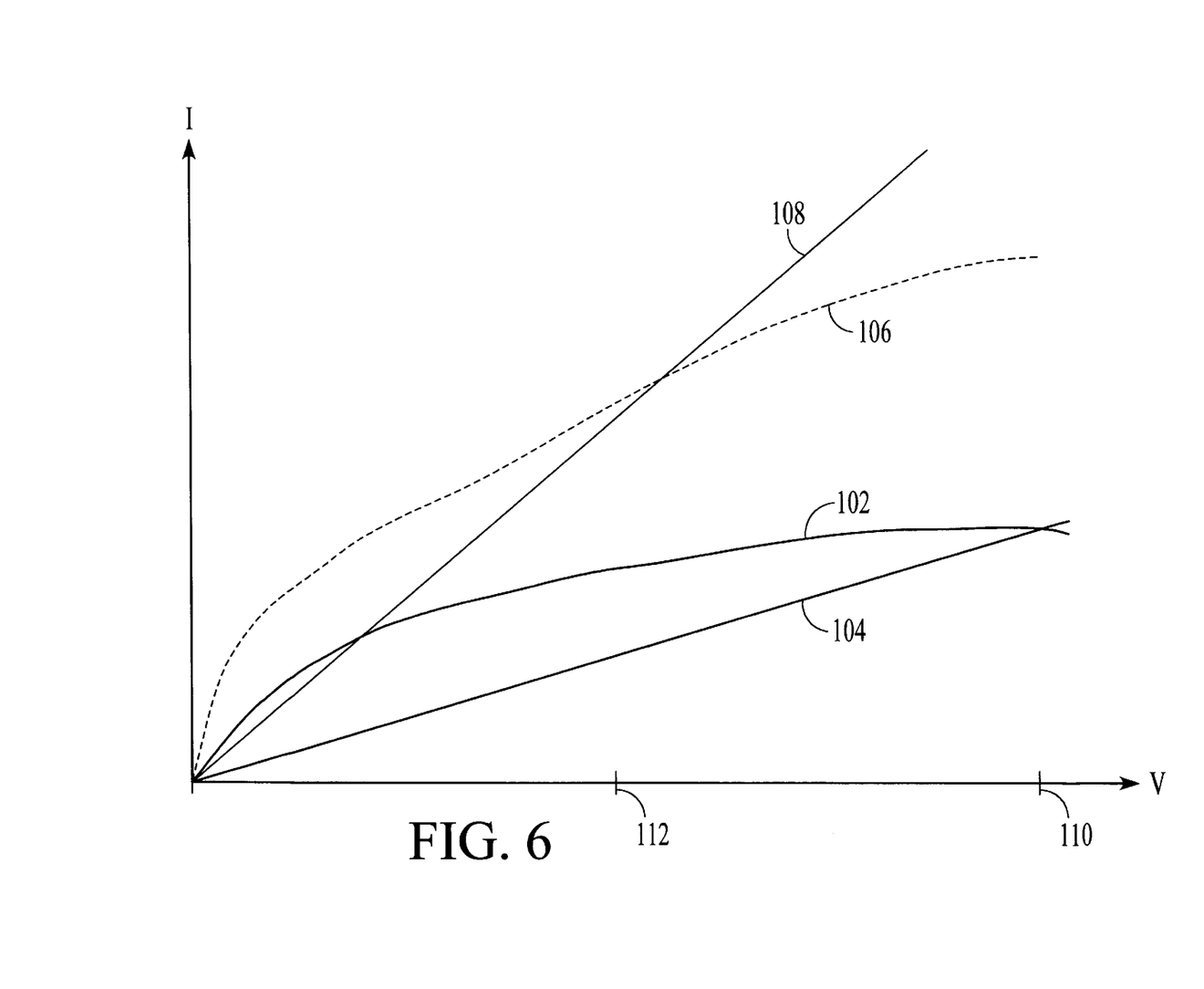
FIG. 6 is a diagram illustrating representative voltage-current curves for load circuits including transistors and resistors.

Combining a transistor with a resistor to form a linearized load as shown in FIG. 6 avoids many problems associated with use of purely resistive loads, including the variations in resistor sizes due to nonuniform processing. The use of common mode output circuit 7 to set the voltage drop across loads 4 and 6 allows the gain associated with these loads to be adjusted easily.

Figure 4B:
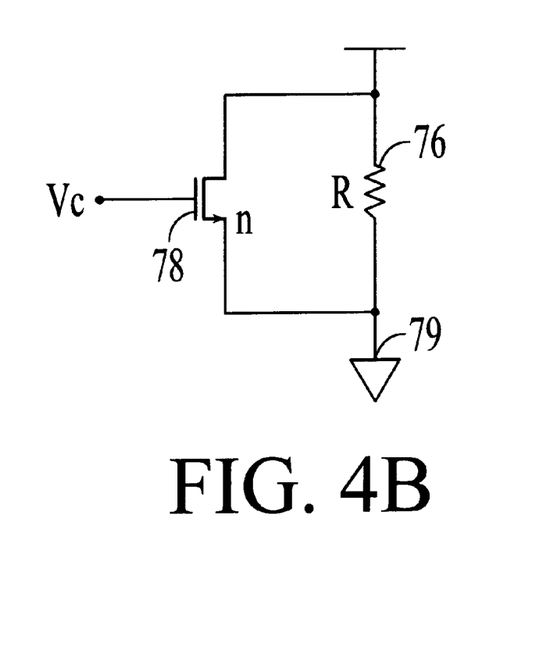

Similarly, FIG. 4B illustrates a load circuit including a resistor 76 and an NMOS transistor 78 that is configured as a triode. The voltage across the circuit is from control voltage level $V_c$ to the voltage at node 79. In a fourth preferred embodiment of the present invention, a circuit as shown in FIG. 4B replaces each of circuits 4 and 6 in the embodiment of FIG. 3. As discussed above in the context of FIG. 4A, the combination of a triode and a resistor to make a substantially linear load is illustrated in the voltage-current curve of FIG. 6.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A mixing apparatus that receives first and second mixing inputs and produces a mixed output comprising:
   a first load circuit, the first load circuit including a first plurality of transistors configured as a first triode and a first diode to provide a substantially linear first load within a predetermined range;
   a second load circuit, the second load circuit including a second plurality of transistors configured as a second triode and a second diode to provide a substantially linear second load within the predetermined range; and
   a mixer circuit being coupled to the first load circuit and the second load circuit to receive the first load and second load, the mixer circuit being adapted to receive the first and second mixing inputs and to produce the mixed output.

2. A mixing apparatus as claimed in claim 1, wherein the transistors of the first load circuit and the second load circuit are PMOS transistors.

3. A mixing apparatus as claimed in claim 2, wherein the mixer circuit comprises a plurality of NMOS transistors.

4. A mixing apparatus as claimed in claim 1, wherein the transistors of the first load circuit and the second load circuit are NMOS transistors.

5. A mixing apparatus as claimed in claim 4, wherein the mixer circuit comprises a plurality of PMOS transistors.

6. A mixing apparatus as claimed in claim 1, wherein the predetermined range includes a range from approximately 0 volts to approximately 1 volt.

7. A mixing apparatus that receives first and second mixing inputs and produces a mixed output comprising:
   a first load circuit, the first load circuit including a first plurality of transistors configured as a first triode and a first diode;
   a second load circuit, the second load circuit including a second plurality of transistors configured as a second triode and a second diode;
   a common mode circuit that operates to provide a substantially linear first load within a predetermined range from the first load circuit and a substantially linear second load within the predetermined range from the second load circuit; and
   a mixer circuit being coupled to the first load circuit and the second load circuit to receive the first load and second load, the mixer circuit being adapted to receive the first and second mixing inputs and to produce the mixed output.

8. A mixing apparatus as claimed in claim 7, wherein the transistors of the first load circuit and the second load circuit are PMOS transistors.

9. A mixing apparatus as claimed in claim 8, wherein the mixer circuit comprises a plurality of NMOS transistors.

10. A mixing apparatus as claimed in claim 9, wherein the common mode circuit comprises:
    a plurality of PMOS transistors; and
    a replica bias circuit that operates to control a voltage level across the first load circuit and the second load circuit.

11. A mixing apparatus as claimed in claim 7, wherein the transistors of the first load circuit and the second load circuit are NMOS transistors.

12. A mixing apparatus as claimed in claim 11, wherein the mixer circuit comprises a plurality of PMOS transistors.

13. A mixing apparatus as claimed in claim 12, wherein the common mode circuit comprises:
    a plurality of NMOS transistors; and
    a replica bias circuit that operates to control a voltage level across the first load circuit and the second load circuit.

14. A mixing apparatus as claimed in claim 7, wherein the predetermined range includes a range from approximately 0 volts to approximately 1 volt.

15. A mixing apparatus that receives first and second mixing inputs and produces a mixed output comprising:
    a first load circuit, the first load circuit including a first combination of transistors and resistors configured as a first triode and a first resistor to provide a substantially linear first load within a predetermined range;
    a second load circuit, the second load circuit including a second combination of transistors and resistors configured as a second triode and a second resistor to provide a substantially linear second load within the predetermined range; and
    a mixer circuit being coupled to the first load circuit and the second load circuit to receive the first load and second load, the mixer circuit being adapted to receive the first and second mixing inputs and to produce the mixed output.

16. A mixing apparatus as claimed in claim 15, wherein the transistors of the first load circuit and the second load circuit are PMOS transistors.

17. A mixing apparatus as claimed in claim 16, wherein the mixer circuit comprises a plurality of NMOS transistors.

18. A mixing apparatus as claimed in claim 15, wherein the transistors of the first load circuit and the second load circuit are NMOS transistors.

19. A mixing apparatus as claimed in claim 18, wherein the mixer circuit comprises a plurality of PMOS transistors.

20. A mixing apparatus as claimed in claim 15, wherein the predetermined range includes a range from approximately 0 volts to approximately 1 volt.

21. A mixing apparatus that receives first and second mixing inputs and produces a mixed output comprising:
    a first load circuit, the first load circuit including a first combination of transistors and resistors configured as a first triode and a first resistor;
    a second load circuit, the second load circuit including a second combination of transistors and resistors configured as a second triode and a second resistor;
    a common mode circuit that operates to provide a substantially linear first load within a predetermined range from the first load circuit and a substantially linear second load within the predetermined range from the second load circuit; and
    a mixer circuit being coupled to the first load circuit and the second load circuit to receive the first load and second load, the mixer circuit being adapted to receive the first and second mixing inputs and to produce the mixed output.

22. A mixing apparatus as claimed in claim 21, wherein the transistors of the first load circuit and the second load circuit are PMOS transistors.

23. A mixing apparatus as claimed in claim 22, wherein the mixer circuit comprises a plurality of NMOS transistors.

24. A mixing apparatus as claimed in claim 23, wherein the common mode circuit comprises:
    a plurality of PMOS transistors; and
    a replica bias circuit that operates to control a voltage level across the first load circuit and the second load circuit.

25. A mixing apparatus as claimed in claim 21, wherein the transistors of the first load circuit and the second load circuit are NMOS transistors.

26. A mixing apparatus as claimed in claim 25, wherein the mixer circuit comprises a plurality of PMOS transistors.

27. A mixing apparatus as claimed in claim 26, wherein the common mode circuit comprises:

a plurality of NMOS transistors; and a replica bias circuit that operates to control a voltage level across the first load circuit and the second load circuit.

28. A mixing apparatus as claimed in claim 21, wherein the predetermined range includes a range from approximately 0 volts to approximately 1 volt.

29. A mixing apparatus that receives first and second mixing inputs and produces a mixed output comprising:

a first load means for providing a substantially linear load;

a second load means for providing a substantially linear load;

a common mode means for adjusting voltage levels of the first load means and the second load means; and a mixing means coupled to the first load means and the second load means to receive the first load and second load, the mixer circuit being adapted to receive the first and second mixing inputs and to produce the mixed output.

30. A mixing apparatus as claimed in claim 29, wherein the first load means includes a plurality of PMOS transistors configured as a first triode and a first diode;

the second load means includes a plurality of PMOS transistors configured as a second triode and a second diode;

the mixing means includes a plurality of NMOS transistors; and the common mode means includes a plurality of PMOS transistors and a replica bias means that operates to control a voltage level across the first load means and the second load means.

31. A mixing apparatus as claimed in claim 29, wherein the first load means includes a plurality of NMOS transistors configured as a first triode and a first diode;

the second load means includes a plurality of NMOS transistors configured as a second triode and a second diode;

the mixing means includes a plurality of PMOS transistors; and the common mode means includes a plurality of NMOS transistors and a replica bias means that operates to control a voltage level across the first load means and the second load means.

32. A mixing apparatus as claimed in claim 29, wherein the first load means includes a combination of PMOS transistors and resistors configured as a first triode and a first resistor;

the second load means includes a combination of PMOS transistors and resistors configured as a second triode and a second resistor;

the mixing means includes a plurality of NMOS transistors; and the common mode means includes a plurality of PMOS transistors and a replica bias means that operates to control a voltage level across the first load means and the second load means.

33. A mixing apparatus as claimed in claim 29, wherein the first load means includes a combination of NMOS transistors and resistors configured as a first triode and a first resistor;

the second load means includes a combination of NMOS transistors and resistors configured as a second triode and a second resistor;

the mixing means includes a plurality of PMOS transistors; and the common mode means includes a plurality of NMOS transistors and a replica bias means that operates to control a voltage level across the first load means and the second load means.

34. A load apparatus for a mixing circuit comprising:

a triode element formed of at least one PMOS transistor, the triode element receiving an input voltage and producing a triode output voltage;

a diode element formed of at least one PMOS transistor, the diode element receiving an input voltage and producing a diode output voltage; and a common node that receives both the triode output voltage and the diode output voltage, thereby obtaining a substantially linear voltage within a predetermined range.

35. The load apparatus of claim 34, wherein the predetermined range includes a range from approximately 0 volts to approximately 1volt.

36. A load apparatus for a mixing circuit comprising:

a triode element formed of at least one NMOS transistor, the triode element receiving an input voltage and producing a triode output voltage;

a diode element formed of at least one NMOS transistor, the diode element receiving an input voltage and producing a diode output voltage; and a common node that receives both the triode output voltage and the diode output voltage, thereby obtaining a substantially linear voltage within a predetermined range.

37. The load apparatus of claim 36, wherein the predetermined range includes a range from approximately 0 volts to approximately 1 volt.

38. A load apparatus for a mixing circuit comprising:

a triode element formed of at least one PMOS transistor, the triode element receiving an input voltage producing a triode output voltage;

a resistive element formed of at least one resistor, the resistive element receiving an input voltage and producing a resistor output voltage; and a common node that receives both the triode output voltage and the resistor output voltage, thereby obtaining a substantially linear voltage within a predetermined range.

39. The load apparatus of claim 38, wherein the predetermined range includes a range from approximately 0 volts to approximately 1 volt.

40. A load apparatus for a mixing circuit comprising:

a triode element formed of at least one NMOS transistor, the triode element receiving an input voltage and producing a diode output voltage;

a resistive element formed of at least one resistor, the resistive element receiving an input voltage and producing a resistor output voltage; and a common node that receives both the triode output voltage and the resistor output voltage, thereby obtaining a substantially linear voltage within a predetermined range.

41. The load apparatus of claim 40, wherein the predetermined range includes a range from approximately 0 volts to approximately 1 volt.

* * * * *